(12) United States Patent  
Itai

(10) Patent No.: US 7,871,711 B2
(45) Date of Patent: Jan. 18, 2011

(54) ORGANIC ELECTROLUMINESCENT ELEMENT AND ORGANIC ELECTROLUMINESCENT DISPLAY

(75) Inventor: Yuichiro Itai, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 893 days.

(21) Appl. No.: 10/594,600

(22) PCT Filed: Mar. 31, 2004

(86) PCT No.: PCT/JP2004/004662

§ 371 (c)(1),
(2), (4) Date: Jun. 8, 2007

(87) PCT Pub. No.: WO2005/101911

PCT Pub. Date: Oct. 27, 2005

(65) Prior Publication Data

US 2007/0285005 A1    Dec. 13, 2007

(51) Int. Cl.
*H01L 51/54* (2006.01)

(52) U.S. Cl. ............... 428/690; 428/917; 313/504; 313/506

(58) Field of Classification Search ............ None
See application file for complete search history.

(56) References Cited

U.S. PATENT DOCUMENTS

| 6,565,993 | B2 * | 5/2003 | Toguchi et al. ............ 428/690 |
| 6,844,670 | B2 | 1/2005 | Kuma et al. |
| 6,872,471 | B2 * | 3/2005 | Epstein et al. ............ 428/690 |
| 6,995,509 | B2 | 2/2006 | Yamazaki et al. |
| 7,504,771 | B2 | 3/2009 | Yamazaki et al. |
| 2003/0127968 | A1 | 7/2003 | Kuma et al. |
| 2003/0157365 | A1 | 8/2003 | Kinoshita et al. |
| 2005/0077817 | A1 | 4/2005 | Yamazaki et al. |
| 2006/0164006 | A1 | 7/2006 | Yamazaki et al. |
| 2009/0174308 | A1 | 7/2009 | Yamazaki et al. |

FOREIGN PATENT DOCUMENTS

| JP | 6-207170 A | 7/1994 |
| JP | 8-78163 A | 3/1996 |
| JP | 10-3990 A | 1/1998 |
| JP | 10-231479 A | 9/1998 |
| JP | 11-204259 A | 7/1999 |
| JP | 2001-118682 A | 4/2001 |
| JP | 2002-63988 A | 2/2002 |
| WO | WO-03/043382 A1 | 5/2003 |
| WO | WO-2004/060026 A1 | 7/2004 |

OTHER PUBLICATIONS

Translation for JP 2001-118682, published Apr. 2001.*

* cited by examiner

*Primary Examiner*—Dawn Garrett
(74) *Attorney, Agent, or Firm*—Birch, Stewart, Kolasch & Birch, LLP

(57) ABSTRACT

The invention relates to an organic EL element having a glass substrate and an anode, a hole-injecting layer, a hole-transport layer, a blue light-emitting layer, a hole-blocking layer, an electron-transport layer, and a cathode formed on the glass substrate sequentially in that order, wherein the electron-transport layer contains an electron-transporting material and a light-emitting material having emission-spectrum peak wavelength of longer than 555 nm, and the light-emitting material consumes the holes, thereby preventing degradation of the electron-transporting material, improving blue chromaticity, and elongating the life of the organic EL element.

10 Claims, 6 Drawing Sheets

FIG.5

|  | RELATIVE LUMINANCE | | CHROMATICITY | |
|---|---|---|---|---|
|  | IMMEDIATELY AFTER INITIATION OF EVALUATION | AFTER 200 HOURS | IMMEDIATELY AFTER INITIATION OF EVALUATION | AFTER 200 HOURS |
| FIRST EXAMPLE | 1 | 0.95 | x=0.152 y=0.189 | x=0.154 y=0.190 |
| SECOND EXAMPLE | 1 | 0.81 | x=0.157 y=0.194 | x=0.161 y=0.199 |
| COMPARATIVE EXAMPLE | 1 | 0.54 | x=0.160 y=0.206 | x=0.162 y=0.207 |

OUTGOING DIRECTION OF LIGHT

ORGANIC ELECTROLUMINESCENT ELEMENT AND ORGANIC ELECTROLUMINESCENT DISPLAY

TECHNICAL FIELD

The invention relates to an organic electroluminescent element and an organic electroluminescent display, and in particular, to an organic electroluminescent element and organic electroluminescent display having a blue light-emitting layer that emits blue light formed between an anode and a cathode.

BACKGROUND ART

Organic electroluminescent elements (hereinafter, organic electroluminescent elements will be referred to as "organic EL elements"), which are easier to reduce in size, lower in power consumption, and capable of surface light emission, and the use thereof in various display devices such as flat display is attracting attention since the applied voltage can be significantly reduced compared to liquid crystal elements.

Such an organic EL element has a light-emitting layer and an electron-transport layer provided at the cathode side of the light-emitting layer, the electron-transport layer transporting electrons to the light-emitting layer. Examples of the light-emitting layer include blue light-emitting layers that emit blue light, red light-emitting layers that emit red light, and green light-emitting layers that emit green light, and the like.

In particular in an the organic EL element having a blue light-emitting layer, because the blue light-emitting layer demands a greater energy for emitting blue light, holes that do not contribute the light emission in the blue light-emitting layer are transferred easily into the electron-transport layer, compared to an organic EL element having a red or green light-emitting layer. The holes transferred into the electron-transport layer are said to bind with an organic matter contained in the electron-transport layer to generate cations, which degrade the electron-transport layer. Therefore, there is a problem in that the luminance of the blue light emitted by the blue light-emitting layer decreases over time, so that the life of the organic EL element is shortened.

There is another problem in that the holes transferred into the electron-transport layer also recombine with electrons to cause the electron-transport layer to emit light in a color other than blue within a wavelength region close to the peak wavelength of blue, thereby deteriorating the blue chromaticity of the light emitted from the blue light-emitting layer.

Hereinafter, explanation on the chromaticity will be given. FIG. 1 is a diagram showing the chromaticity coordinates in the XYZ color system. The chromaticity is expressed with the values on the two-dimensional chromaticity coordinate (x, y) in the XYZ color system specified by CIE (International Commission on Illumination). The chromaticity (x, y) is obtained from emission spectrum distribution. Ideal red chromaticity point A, ideal blue chromaticity point B, and ideal green chromaticity point C are shown in FIG. 1. Displays are desired to achieve high chromaticity of each of the lights in three primary colors, red, blue, and green, and a greater area (color reproduction range) of the triangle defined by the sides connecting the three chromaticity points. A high chromaticity means that any of the three primary colors, red, blue, and green approaches to its ideal chromaticity point A, B, or C. In the case of blue, the chromaticity is better when the value on y coordinate is closer to 0.

A method of improving the red chromaticity of an organic EL element having a red light-emitting layer has been proposed (for example, see Patent Document 1 below) in which a red light-emitting material is included in the electron-transport layer adjacent to the cathode side of the red light-emitting layer, holes and electrons not contributing to the light emission from the red light-emitting layer recombine at the red light-emitting material to emit light in the same color, red, as the red light-emitting layer.

However, if the method is applied to an organic EL element blue light-emitting layer, there is a problem in that the selection of the electron-transporting material constituting the electron-transport layer is greatly restricted. This is because: a blue light-emitting material that emits blue light has to be contained in the electron-transport layer; but the energy gap of the electron-transport layer has to be greater than that of the blue light-emitting material in order to allow the blue light-emitting material to emit light because the energy gap of the blue light-emitting material is great.

A method of improving the chromaticity of the emission color of a light-emitting layer has been proposed as a conventional technique (for example, see Patent Document 2 below) in which a hole-blocking layer is provided between a light-emitting layer and an electron-transport layer so as to block the holes migrating through the light-emitting layer into the cathode side and so as to restrict emission at the electron-transport layer.

However, because it is difficult to block the holes migrating into the electron-transport layer completely by the hole-blocking layer, there are also problems in that the holes that have migrated through the hole-blocking layer into the electron-transport layer recombine with electrons to cause the electron-transport layer to emit a color other than blue near the peak wavelength of blue, resulting in reduction in the chromaticity in blue—the emission color of the blue light-emitting layer. There are also problems in that the electron-transport layer is deteriorated by the holes transferred into the electron-transport layer, which causes deterioration of the electron transporting performance of the electron-transport layer, gradual decrease in blue luminance over time, and consequent shortening of the life of the organic EL element.

Patent Document 1: Japanese Patent Application Laid-Open (JP-A) No. 10-231479

Patent Document 2: Japanese Patent Application No. 10-2986

SUMMARY OF THE INVENTION

A general object of the invention, which was made in view of the problems above, is to provide an organic electroluminescent element and an organic electroluminescent display higher in blue chromaticity and longer in the life thereof A more specific object of the invention is to provide an organic electroluminescent element comprising a blue light-emitting layer that emits blue light provided between an anode and a cathode facing each other, a hole-blocking layer provided in contact with the cathode side of the blue light-emitting layer that restricts migration of holes from the blue light-emitting layer toward the cathode side, and an electron-transport layer provided in contact with the cathode side of the hole-blocking layer, wherein the electron-transport layer contains an electron-transporting material and a light-emitting material having emission-spectrum peak wavelength of longer than 555 nm.

According to the invention, a light-emitting material having emission-spectrum peak wavelength of longer than 555 nm is contained in the electron-transport layer provided at the cathode side of the hole-blocking layer. Therefore, the holes migrated through the hole-blocking layer into the electron-transport layer and electrons are recombined at the light-emitting material to emit a light having a wavelength of longer than 555 nm. By the emission of a light having a wavelength of longer than 555 nm, to which the human eye is less sensitive, the influence on the blue chromaticity can be reduced, the holes can be consumed, the degradation of the electron-transporting material is suppressed, and the life of the organic electroluminescent element can be elongated.

The energy gap of the light-emitting material may be smaller than that of the electron-transporting material; the holes migrated through the hole-blocking layer into the electron-transport layer is more likely to be accumulated in the light-emitting material smaller in energy gap than the electron-transporting material, and the number of the holes accumulated in the electron-transporting material declines. As a result, the recombination between holes and electrons in the electron-transporting material is suppressed, and the life of the organic electroluminescent element can be elongated.

The light-emitting material for use may be at least one material selected from the group consisting of chloro[2,3,7,8,12,13,17,18-octaethylporphrinato]iron (trivalent), 5,10,15,20-tetraphenylporphine nickel (bivalent), and 4-(dicyanomethylene)-2-methyl-6-(p-dimethylaminostyry 1)-4H-pyran.

The material used for the blue light-emitting layer may contain a 1,3,6,8-tetrasubstituted pyrene compound represented by the following Formula (1). In the following Formula (1), $R^1$ to $R^4$ may be the same as or different from each other, and each represent a group represented by the following Formula (2).

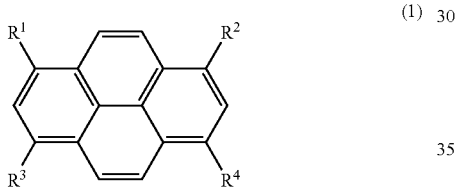

(1)

In the following Formula (2), $R^5$ to $R^9$ may be the same as or different from each other, and each represent a hydrogen atom or a substituent. At least one of $R^5$ to $R^9$ represents a substituted or unsubstituted aryl group.

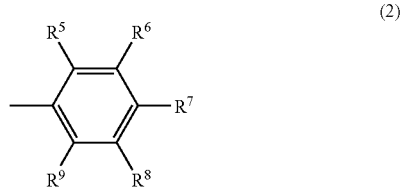

(2)

The blue light-emitting layer, when containing a 1,3,6,8-tetrasubstituted pyrene compound, is superior in the emitting efficiency, luminance, color purity, and the like of the blue light and allows elongation of the life of the organic electroluminescent element.

Another object of the invention is to provide organic electroluminescent display having the organic electroluminescent element described above.

According to the invention, it is possible to improve the blue chromaticity and elongate the life of the organic electroluminescent display.

A color-converting layer that converts the blue light from the blue light-emitting layer into green light and red light can be provided in the organic electroluminescence display so as to realize full color display.

BRIEF DESCRIPTION OF THE DRAWINGS

FIG. 5 is a table showing the relative luminance and chromaticity of the blue light from an organic EL element immediately after initiation of the evaluation and 200 hours after the initiation of the evaluation.

BEST MODE FOR CARRYING OUT THE INVENTION

Hereinafter, embodiments of the present invention will be described with reference to drawings.

First Embodiment

Figure 2:
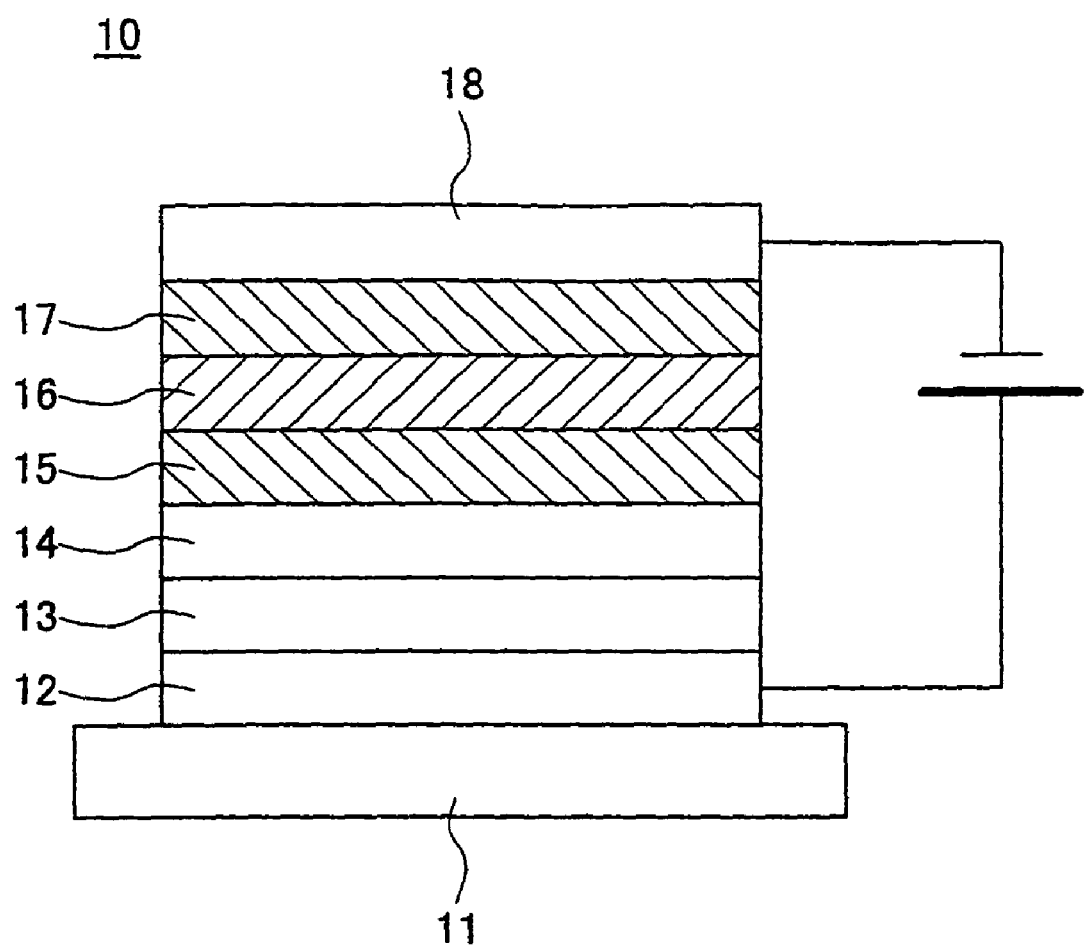
FIG. 2 is a sectional view of an organic EL element according to the first embodiment of the invention.

FIG. 2 is a cross-sectional view of an organic EL element according to the first embodiment of the invention. As shown in FIG. 2, the organic EL element 10 includes a glass substrate 11, and an anode 12, a hole-injecting layer 13, a hole-transport layer 14, a blue light-emitting layer 15, a hole-blocking layer 16, an electron-transport layer 17 containing an electron-transporting material and a light-emitting material having an emission spectrum peak wavelength of greater than 555 nm, and a cathode 18 provided on the glass substrate 11 in that order.

The organic EL element 10 has a film thickness of approximately 10 to 1,000 nm. A thickness of more than 1,000 nm leads to shielding of the light emitted in the blue light-emitting layer 15, while a thickness of less than 10 nm leads to insufficient luminance because the thickness of the blue light-emitting layer 15 itself is excessively small.

The anode 12 and the cathode 18 are electrodes for applying voltage at a desired position of the organic EL element 10. For the anode 12, for example, of ITO or IZO (indium zinc oxide) may be used. For the cathode 18, for example, an Al/LiF electrode or an Ag/Mg electrode may be used.

For the hole-injecting layer 13, for example, 2-TNATA represented by the following Formula (3) (manufactured by Bando Chemical Industries), m-MTDATA represented by the following Formula (4) (manufactured by Bando Chemical Industries), copper phthalocyanine, or polyaniline may be used. The thickness of the hole-injecting layer 13 is not particularly limited, and may be selected appropriately according to the purpose. The thickness is preferably, for example, approximately 1 to 100 nm, more preferably, 5 to 50 nm. The hole-injecting layer 13 may be provided or not provided.

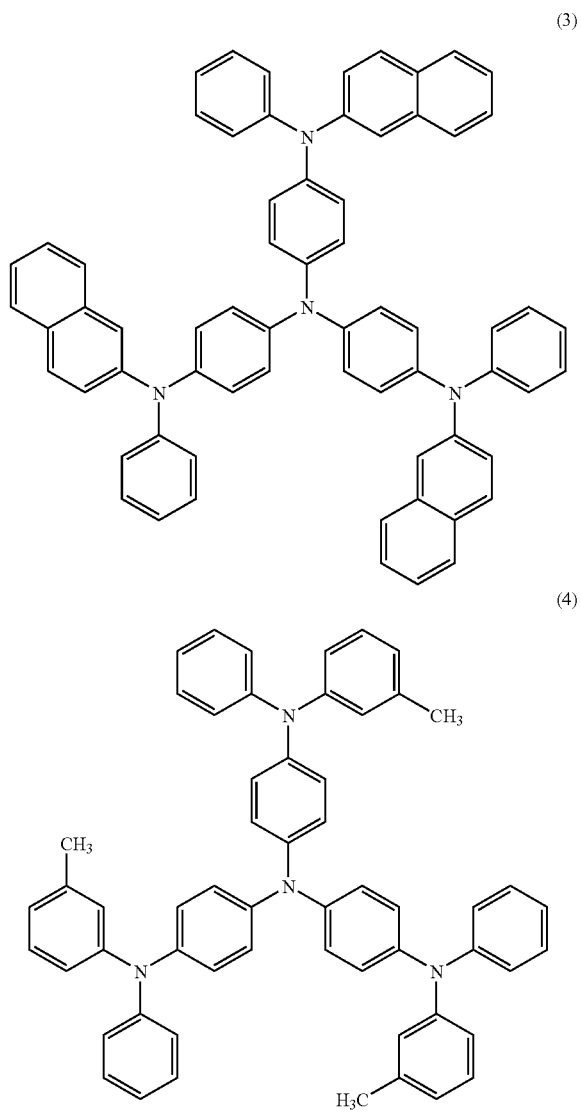

(3)

(4)

The hole-transport layer 14 is made of a material higher in hole-transporting performance, and examples thereof include aromatic amine compounds, carbazole, imidazole, triazole, oxazole, oxadiazole, polyarylalkane, pyrazoline, pyrazolone, phenylenediamine, arylamines, amino-substituted chalcones, styrylanthracene, fluorenone, hydrazone, stilbene, silazane, styrylamine, aromatic dimethylidine compounds, porphyrin compounds, polysilane compounds, conductive oligomers and polymers such as poly (N-vinylcarbazole), aniline copolymers, thiophene oligomers and polymers, and polythiophene, carbon films, and the like. These compounds may be used alone or in combination of two or more. More specific examples include α-NPD represented by the following Formula (5) (manufactured by Toyo Ink Mfg.), EL-022 (manufactured by Hodogaya Chemical), and the like.

The thickness of the hole-transport layer 14 is controlled in the range of 1 to 100 nm, and is adjusted adequately according to the number of the layers constituting the organic EL element and the total thickness of the organic EL element 10. The hole-transport layer 14 may be provided or not provided.

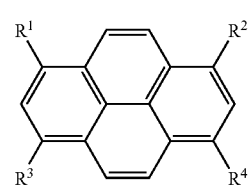

(5)

The blue light-emitting layer 15 contains a host material and a light-emitting material emitting blue light. Examples of the light-emitting material for use include 1,3,6-tetrasubstituted pyrene compounds represented by the following Formula (1).

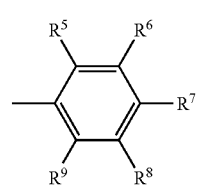

(1)

In Formula (1), $R^1$ to $R^4$ may be the same as or different from each other and each represent a group represented by the following Formula (2). In the following Formula (2), $R^5$ to $R^9$ may be the same as or different from each other, and each represent a hydrogen atom or a substituent; and at least one of $R^5$ to $R^9$ represents a substituted or unsubstituted aryl group.

(2)

When a 1,3,6,8-tetrasubstituted pyrene compound is contained in the blue light-emitting layer 15, the luminous efficiency, emission luminance, and color purity of the blue light can be improved and the life of the organic EL element 10 can be elongated.

For example, at least one compound selected from the group consisting of 1,3,6,8-tetra(4-biphenyl)pyrene represented by the following Formula (6), 1,3,6,8-tetra(4-dibenzofuranyl)pyrene represented by the following Formula (7), and 1,3,6,8-tetra(4-dibenzothionyl)pyrene represented by the following Formula (8) can be used as the 1,3,6,8-tetrasubstituted pyrene compound. The thickness of the blue light-emitting layer 15 is selected properly in the range of 1 to 100 nm. The light-emitting material emitting blue light is not particularly limited, and may be a known blue light-emitting material. For example, 4,4'-bis(9-carbazolyl)-biphenyl (CBP) represented by the following Formula (9) may be used as the host material.

(6)

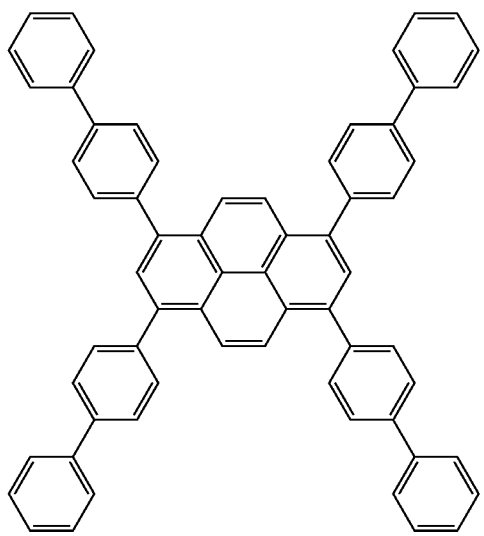

(7)

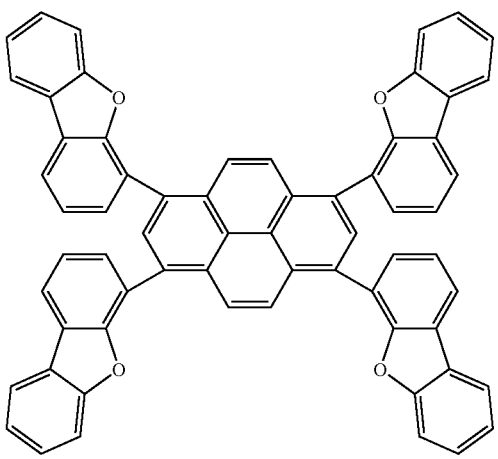

(8)

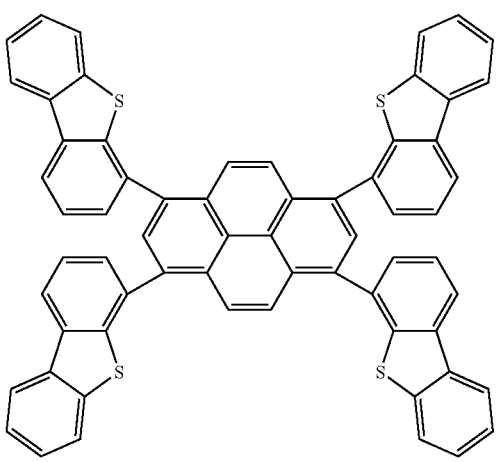

-continued (9)

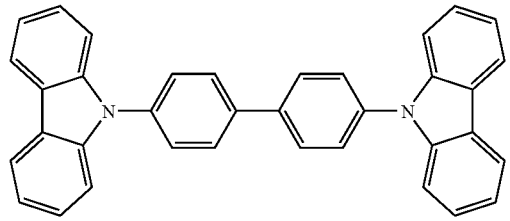

The method of preparing the 1,3,6,8-tetrasubstituted pyrene compound is not particularly limited and may be selected appropriately from known methods according to the purpose. The following method is can be mentioned as a preferable example.

First, a 1,3,6,8-tetrahalogenated pyrene is prepared in reaction of one equivalent of pyrene and 4 equivalents of halogen. Tetrahalogenation occurs easily at 1, 3, 6, and 8 positions of the pyrene because of its reactivity. A preferable halogenation method may be similar to a general aromatic hydrocarbon halogenation technique in which an elemental halogen is added to pyrene dissolved in a solvent, the technique being described in Annalen der Chemie 531, p. 81. Chlorine, bromine, iodine, and the like are advantageous in consideration of the next reaction, and, among them, chlorine, bromine, and the like are favorable due to easiness of carrying out halogenation reaction.

Then, the 1,3,6,8-tetrahalogenated pyrene and an aryl boronic acid corresponding to the desired compound are heated in the presence of a catalyst and a base in the so-called "Suzuki coupling" reaction, whereby a 1,3,6,8-tetrasubstituted pyrene compound can be obtained.

Examples of the catalyst for use include palladium compounds such as tetrakis(triphenylphosphine) palladium (0) and the like. Examples of the base include sodium carbonate, calcium carbonate, sodium hydroxide, sodium alkoxides such as sodium-t-butoxide, and the like.

A known preparative method can be used for the preparation of 1,3,6,8-tetra(4-biphenyl)pyrene. Hereinafter, a preparation method for preparing 1,3,6,8-tetra(4-biphenylyl) pyrene will be described as an example in which the above technique is used. 1,3,6,8-tetrabromopyrene is first prepared in reaction of pyrene and bromine. Then, 4.4 equivalents of 4-biphenyl boronic acid represented by the following Formula (10), 10 equivalents of aqueous 2 mol/l sodium carbonate solution, and 0.12 equivalent of tetrakis(triphenylphosphine) palladium (0) are added to 1,3,6,8-tetrabromopyrene, and the mixture is refluxed under heat for 3 hours using benzene as the solvent so as to carry out the reaction. After the reaction, the reaction mixture is cooled and washed with water several times, and benzene is distilled off. The residual oily product is then washed with methanol and recrystallized in THF-methanol to give a crude reaction product. The reaction product is purified by vacuum sublimation to give 1,3,6, 8-tetra(4-biphenyl)pyrene.

(10)

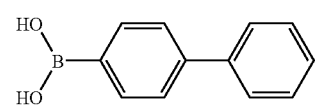

The hole-blocking layer 16 preferably has a function to control the migration of the holes from anode 12 to cathode 18. The material for the hole-blocking layer 16 is not particularly limited and may be selected appropriately according to the purpose. For example, aluminum hydroxyquinoline-oxybiphenyl complex (hereinafter, referred to as "BAlq") can be used for the hole-blocking layer 16.

The thickness of the hole-blocking layer 16 is not particularly limited and may be selected according to the purpose. The thickness is, for example, usually, approximately 1 to 500 nm, preferably 10 to 50 nm.

When the hole-blocking layer 16 is provided, a part of the holes that have not contributed to the blue light emission in the blue light-emitting layer 15 is blocked. The electron-transport layer 17 contains an electron-transporting material higher in electron-transporting performance, a light-emitting material having emission-spectrum peak wavelength of longer than 555 nm, and the like. The light having a peak wavelength of 555 nm (green light) is a light to which the human eye is most sensitive, and is higher in the so-called visibility. The visibility declines gradually as the emission-spectrum wavelength shifts from the peak wavelength of 555 nm to a shorter wavelength (blue light) or to a longer wavelength (red light). The visibility refers to sensitivity representing recognizability when observed with the human eye. Therefore, even if a light lower in the visibility is included, the influence thereof on blue chromaticity is limited.

The peak blue wavelength is located around 460 nm, which is shorter than 555 nm. Thus as described above, when the electron-transporting material contains a light-emitting material which has a peak at a wavelength apart from the peak blue wavelength and which emits a light in a wavelength region lower in visibility, the holes migrating through the hole-blocking layer 16 recombine with electrons in the light-emitting material to emit a light having a wavelength of longer than 555 nm to which the human eye is less sensitive, thereby enabling reduction in the influence on the blue chromaticity, consumption of the holes in the light-emitting material, suppression of the degradation of the electron-transporting material, and elongation of the life of the organic EL element 10.

In addition, it is preferable to select a material in which the energy gap of the light-emitting material is smaller than that of the electron-transporting material. Such a material facilitates consumption of holes by the light-emitting material, and reduces the number of the holes accumulated in the electron-transporting material.

The content of the light-emitting material in the electron-transporting material is, for example, in the range of 0.01 to 50 vol % with respect to the volume of the electron-transport layer 17. The content of the light-emitting material is preferably in the range of 0.1 to 10 vol % in view of the suppression of the deterioration in the electron mobility in the electron-transporting material.

For example, at least one light-emitting material selected from the group consisting of a porphylene light-emitting material, chloro[2,3,7,8,12,13,17,17-octaethylporphrinato]iron (trivalent) (manufactured by Kanto Kagaku Co. Inc.), 5,10,15,20-tetraphenylporphine nickel (bivalent) (manufactured by Kanto Kagaku Co. Inc.), and 4-(dicyanomethylene)-2-methy-6-(p-dimethylaminostyryl)-4H-pyran represented by the following Formula (11) (DCM derivative) may be used as the light-emitting material.

The thickness of the electron-transport layer 17 is not particularly limited and may be selected appropriately according to the purpose, and is, for example, usually approximately 1 to 500 nm, preferably 10 to 50 nm.

When the light-emitting material is applied, for example, Alq (aluminum quinoline complex) may be used as the electron-transporting material. The electron-transport layer 17 is prepared by codepositing an electron-transporting material with a light-emitting material. The electron-transport layer 17 may be a single layer or a laminate of two or more layers.

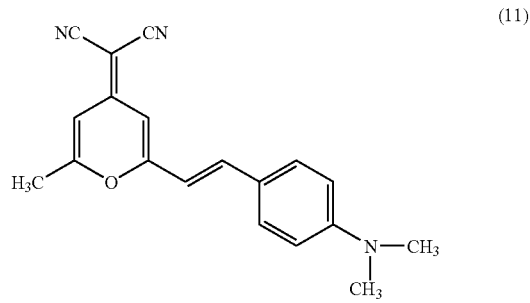

(11)

Each of the layers 12 to 18 in the organic EL element 10 is formed preferably by any one of the methods such as a vapor deposition method, a wet film-forming method, an electron beam method, a sputtering method, a reactive sputtering method, a MBE (molecule beam epitaxy) method, a cluster ion beam method, an ion plating method, a plasma polymerization (high-frequency excitation ion plating) method, a molecule laminating method, a LB method, a printing method, a transfer method, and the like. Each of the layers 12 to 18 in the organic EL element 10 is formed, for example, by a vacuum deposition at a pressure of $1.0 \times 10^{-4}$ Pa with the temperature of the glass substrate 11 being set to room temperature.

In the present embodiment, the electron-transport layer 17 containing an electron-transporting material which has a smaller energy gap than that of the electron-transporting material and which emits a light at a wavelength of longer than 555 nm is provided on the cathode 18 side of the hole-blocking layer 16 in the organic EL element 10 described above; therefore the holes migrating through the hole-blocking layer 16 recombine with electrons in the light-emitting material to emit a light having a wavelength of longer than 555 nm to which the human eye is less sensitive, thereby enabling reduction in the influence on the blue chromaticity, consumption of the holes in the light-emitting material, suppression of the degradation of the electron-transporting material, and elongation of the life of the organic EL element 10. As an alternative, an electron-transport layer not containing a light-emitting material may be provided on the cathode 18 side of the electron-transport layer 17.

First Example

An organic EL element of First Example was prepared in the following manner. On a glass substrate, an ITO electrode having a film thickness of 150 nm as an anode, a 2-TNATA layer as a hole-injecting layer having a film thickness of 140 nm and containing an acceptor F4-TCNQ (2,3,5,6-tetrafluoro-7,7,8,8-tetracyanoquinodimethane) in an amount of 0.1 vol %, an α-NPD layer as a hole-transport layer having a film thickness of 10 nm, a blue light-emitting layer consisting of a host material CBP which has a film thickness of 20 nm and which contains 1,3,6,8-tetra(4-biphenyl)pyrene in an amount of 10 vol %, a BAlq layer as a hole-blocking layer having a film thickness of 10 nm, an Alq (energy gap 2.73 eV) layer as an electron-transport layer which has a film thickness of 20 nm and which contains a light-emitting material chloro[2,3,7,8,12,13,17,18-octaethylporphrinato]iron (trivalent, manufactured by Kanto Kagaku Co. Inc.) in an amount of 1 vol % as an electron-transporting material, and an Al/LiF laminate film as a cathode consisting of a lithium fluoride film having a film thickness of 0.5 nm and an Al film having a film thickness of 100 nm, were sequentially in that order by vacuum deposition. As will be described below, chloro[2,3,7,8,12,13,17,18-octaethylporphrinato]iron (trivalent) is a light-emitting material that emits a light in the red to infrared region, and the energy gap thereof is smaller than that of Alq (2.73 eV).

Second Example

Figure 4:
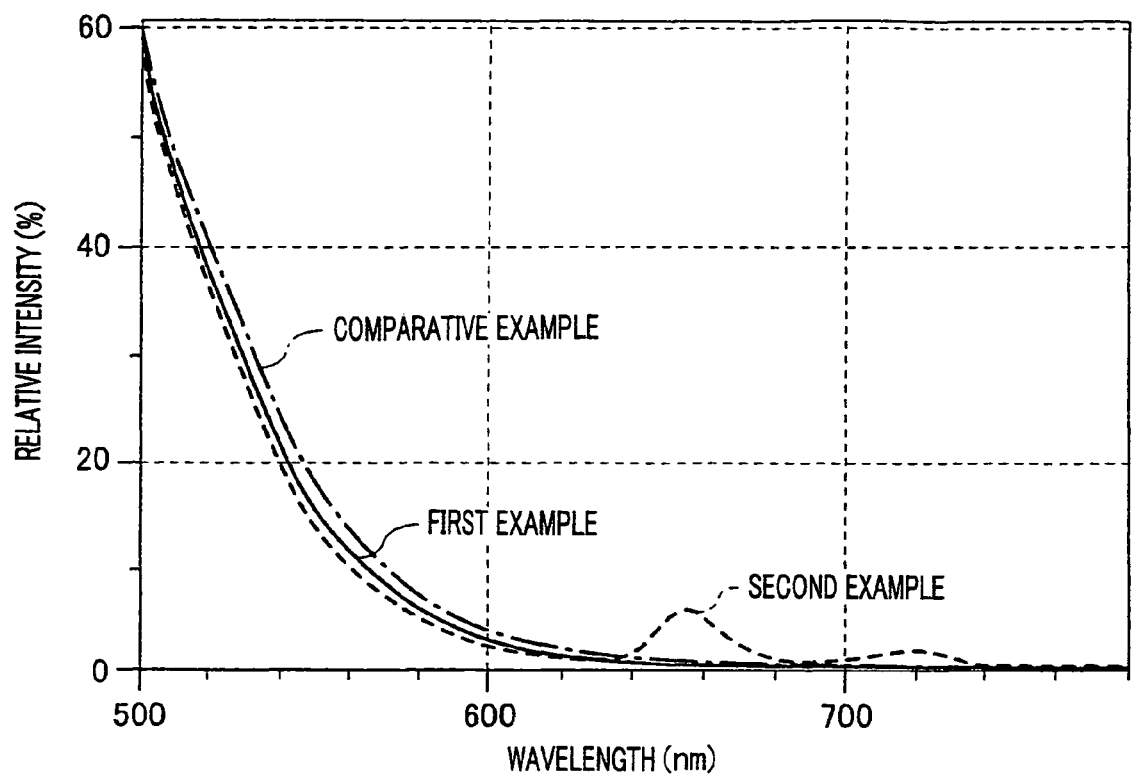
FIG. 4 is an expanded chart of the emission spectra shown in FIG. 3 in the area of a wavelength of 500 to 780 nm.

An organic EL element of Second Example is the same as that of First Example, except that a red light-emitting material, 5,10,15,20-tetraphenylporphine nickel (bivalent), was used in place of the light-emitting material used in the organic EL element of First Example. 5,10,15,20-tetraphenylporphine nickel (bivalent) was contained at a content of 1 vol % in Alq (energy gap 2.73 eV). As shown in FIG. 4 below, because 5,10,15,20-tetraphenylporphine nickel (bivalent) has a peak wavelength of 655 nm, the energy gap of 5,10,15,20-tetraphenylporphine nickel (bivalent) is smaller than the energy gap of Alq (2.73 eV).

Comparative Example

An organic EL element of Comparative Example is the same as that of First Example, except that the electron-transport layer is formed only with Alq (film thickness: 20 nm).

[Evaluation of Emission Spectrum, Chromaticity, and Luminance]

Relative distribution of the emission spectrum of each of the organic EL elements of First and Second Examples and Comparative Example was measured. The emission spectrum was measured in the air by using a luminance meter capable of measurement of emission spectrum, for example, CS 1000 manufactured by KONICA MINOLTA.

Figure 3:
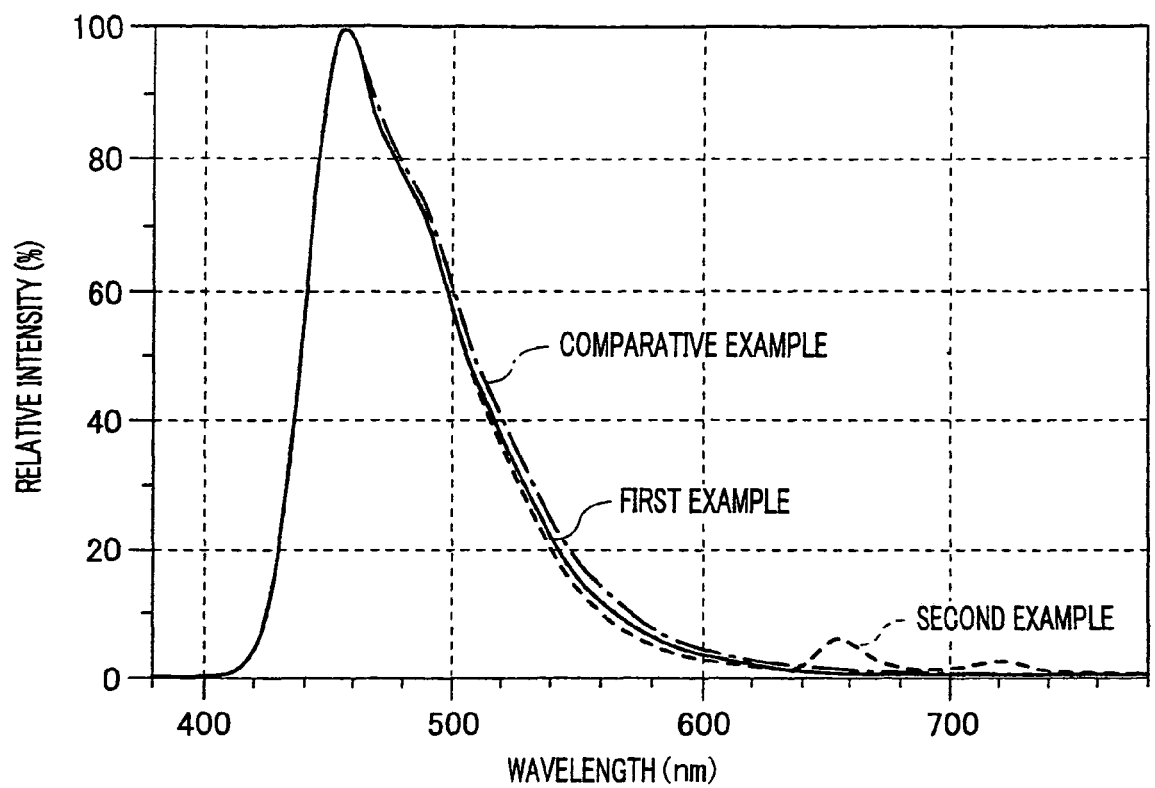
FIG. 3 is a chart showing relative distribution of the emission spectra of the organic EL elements of First and Second Examples and Comparative Example.

FIG. 3 is a chart showing the relative distribution of the emission spectra of the organic EL elements of First and Second Examples and Comparative example. FIG. 4 is an expanded chart of the emission spectra shown in FIG. 3 with respect to the wavelength range of 500 to 780 nm.

As apparent from FIGS. 3 and 4, the intensity around 520 to 600 nm in the light emission spectrum of each of the organic EL elements of First and Second Examples was smaller than that in the light emission spectrum of the organic EL element of Comparative Example. It is easily conceivable that the Alq layer (peak wavelength 520 nm), which is an electron-transport layer, emits light in the organic EL element of Comparative Example while the Alq layer as an electron-transporting material provided in the First or Second Example does not emit light.

In the organic EL element of First Example, the light-emitting material, chloro[2,3,7,8,12,13,17,18-octaethylporphrinato]iron (trivalent), contained in the electron-transport layer emits a red light which has a peak wavelength of 750 nm (red) and which includes infrared light having a wavelength of 800 nm or more to which the human eye is less sensitive, therefore, the blue chromaticity described below can be improved. In the emission spectrum of First Example shown in FIGS. 3 and 4, the peak at 750 nm of chloro[2,3,7,8,12,13,17,18-octaethylporphrinato]iron (trivalent) does not appear since the intensity thereof is small compared to the peak intensity of the light-emitting layer.

In the organic EL element of Second Example, the light-emitting material, 5,10,15,20-tetraphenylporphine nickel (bivalent), emits a light having the emission spectrum peak at a wavelength near 655 nm, which is hard to sense with the eye. Accordingly, First and Second Examples give a light better in the blue chromaticity described below than Comparative Example.

Next, the time-dependence of the relative luminance and the chromaticity of the organic EL elements of First and Second Examples and Comparative example was examined. The relative luminance and the chromaticity were determined from the emission spectrum above.

FIG. 5 is a table showing the relative luminance and chromaticity of the blue light emitted from each organic EL element immediately after the initiation of the evaluation and 200 hours after the initiation of the evaluation. In FIG. 5, the luminance at 200 hours after the initiation of the evaluation is shown as a relative value assuming the luminance of the organic EL element immediately after the initiation of the evaluation is 1.

As shown in FIG. 5, the relative luminance 200 hours after the initiation of the evaluation is 0.54 in the case of the organic EL element of Comparative Example, 0.95 in the case of the organic EL element of First Example, and 0.81 in the case of the organic EL element of Second Example. It is found that the organic EL elements of First and Second Examples exhibit smaller reduction in luminance over time than the organic EL element of Comparative Example.

Figure 1:
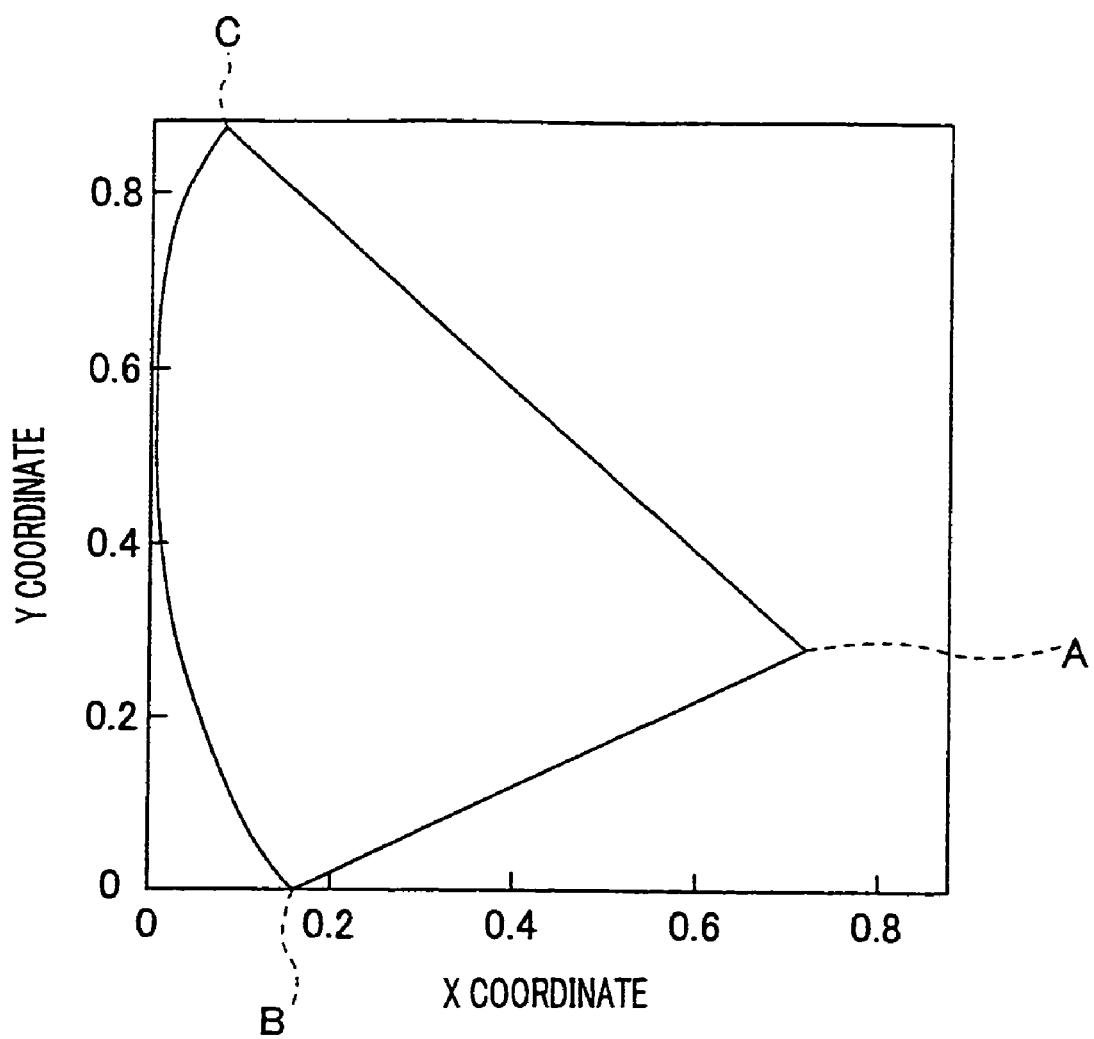
FIG. 1 is a diagram showing the chromaticity coordinates in the XYZ color system.

As described in FIG. 1 above, if the emission color is blue, the blue chromaticity is better when the value for the y coordinate of the chromaticity (x, y) is closer to 0. As shown in FIG. 5, the value for the y coordinate of the chromaticity immediately after the initiation of the evaluation is 0.206 in the case of the organic EL element of Comparative Example, 0.189 in the case of the organic EL element of First Example, and 0.194 in the case of the organic EL element of Second Example. It is found that the organic EL elements of First and Second Examples are better in blue chromaticity than the organic EL element of Comparative Example.

Further, the value for the y coordinate of the chromaticity 200 hours after the initiation of the evaluation is 0.207 in the case of the organic EL element of Comparative Example, 0.190 in the case of the organic EL element of First Example, and 0.199 in the case of the organic EL element of Second Example. Because the blue chromaticity of the organic EL elements of First and Second Examples is better than the blue chromaticity of the organic EL element of Comparative example even when 200 hours have elapsed, it is found that the favorable chromaticity is retained and the service life is elongated in the case of the organic EL elements of First and Second Examples, compared to the organic EL element of Comparative example.

Second Embodiment

Figure 6:
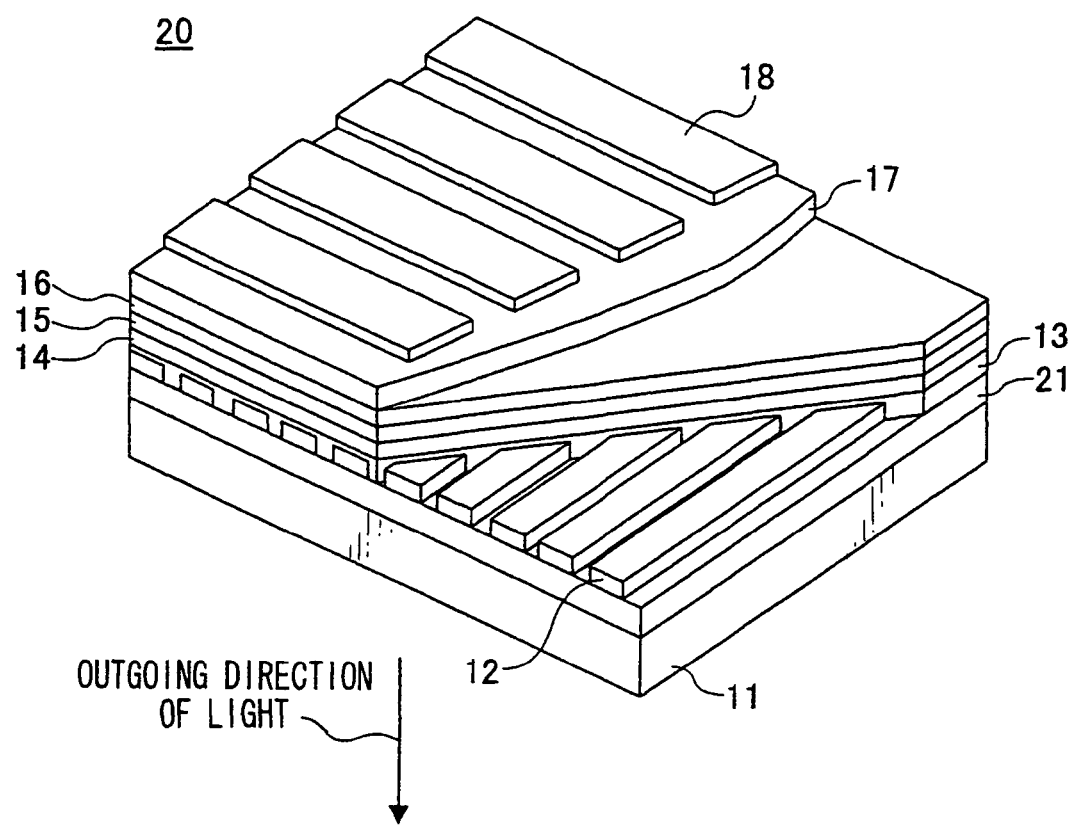
FIG. 6 is a schematic perspective view illustrating the configuration of an organic electroluminescent display (organic EL display) according to the second embodiment of the invention.

FIG. 6 is a schematic perspective view illustrating the rough configuration of an organic electroluminescent display (organic EL display) according to the second embodiment of the invention.

As shown in FIG. 13, the organic EL display 20 has a glass substrate 11, and a color-converting layer 21, anodes 12, a hole-injecting layer 13, a hole-transport layer 14, a blue light-emitting layer 15, a hole-blocking layer 16, an electron-transport layer 17 including an electron-transporting material and a light-emitting material contained in the electron-transporting material, and cathodes 18 provided sequentially in that order on the glass substrate 11, wherein the cathodes 18 and the anodes 12 cross each other orthogonally.

The color-converting layer 21 is provided so as to convert the blue light emitted from the blue light-emitting layer 15 to red light and green light (color conversion). Although not shown in the Figure, the color-converting layer 21 has, for example, a red-fluorescence medium, a green-fluorescence medium, and a region not containing a red-fluorescence medium nor a green-fluorescence medium (blue-light emitting region). Examples of the red-fluorescence medium for use include materials containing 4-dicyanomethylene-4H-pyran and 4-dicyanomethylene-thiopyran. Examples of the green-fluorescence medium for use include materials containing cyanine or merocyanine. Examples of other materials for the red-and green-fluorescence media include the materials described in JP-A No. 5-258860.

When such a color-converting layer 21 is provided, the organic EL display 20 can conduct full color displaying. Light emission from the organic EL display 20 is performed by designating the ITO electrode and the Al/LiF electrode in the region of the blue light-emitting layer 15 the light emission from which is desired, and applying voltage therebetween.

It is possible to improve the chromaticity of the full-color organic EL display 20 and elongate the life thereof in such a configuration.

Favorable embodiments of the invention have so far been described in detail. However, the invention is not limited to these specific embodiments, and various modifications and alterations can be made within the invention described in the Claims.

INDUSTRIAL APPLICABILITY

According to the invention, the electron-transport layer containing an electron-transporting material which has a smaller energy gap than that of the electron-transporting material and which emits a light at a wavelength of longer than 555 nm is provided on the cathode side of the hole-blocking layer; therefore the holes migrating through the hole-blocking layer recombine with electrons in the light-emitting material to emit light, thereby suppressing the light emission from the electron transporting material, improving the blue chromaticity, and elongation of the life of the organic EL element.

What is claimed is:

1. An organic electroluminescent element comprising:
   a blue light-emitting layer that emits blue light provided between an anode and a cathode facing each other;
   a hole-blocking layer provided in contact with the cathode side of the blue light-emitting layer, the hole-blocking layer restricting migration of holes from the blue light-emitting layer to the cathode side; and
   an electron-transport layer provided in contact with the cathode side of the hole-blocking layer, wherein
   the electron-transport layer includes an electron-transporting material and a light-emitting material having an emission spectrum peak wavelength of longer than 555 nm, wherein said emission spectrum peak wavelength of said light-emitting material falls in an infrared region, and wherein
   the organic electroluminescent element emits blue light.

2. The organic electroluminescent element of claim 1, wherein an energy gap of the light-emitting material is smaller than an energy gap of the electron-transporting material.

3. The organic electroluminescent element of claim 1, wherein the light-emitting material is at least one selected from the group consisting of chloro [2,3,7,8,12,13,17,18-octaethylporphrinato] iron (trivalent), 5,10,15,20-tetraphenylporphine nickel (bivalent), and 4-(dicyanomethylene)-2-methyl-6-(p-dimethylaminostyryl)-4H-pyran.

4. The organic electroluminescent element of claim 1, wherein the light-emitting material is contained in the range of 0.01 to 50 vol % based on a volume of the electron-transport layer.

5. The organic electroluminescent element of claim 1, wherein a material of the blue light-emitting layer includes a 1,3,6,8-tetrasubstituted pyrene compound represented by the following Formula (1):

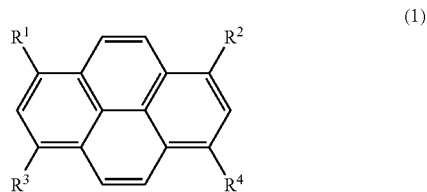

(1)

wherein, in Formula (1), $R^1$ to $R^4$ may be the same as or different from each other, and each represent a group represented by the following Formula (2):

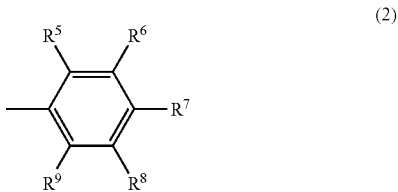

(2)

wherein, in Formula (2), $R^5$ to $R^9$ may be the same as or different from each other, and each represent a hydrogen atom or a substituent, and at least one of $R^5$ to $R^9$ represents a substituted or unsubstituted aryl group.

6. The organic electroluminescent element of claim 5, wherein the 1,3,6,8-tetrasubstituted pyrene compound is at least one selected from the group consisting of 1,3,6,8-tetra (4-biphenyl)pyrene, 1,3,6,8-tetra(4-dibenzofuranyl)pyrene, and 1,3,6,8-tetra(4-dibenzothionyl)pyrene.

7. An organic electroluminescent display comprising the organic electroluminescent element of claim 1.

8. The organic electroluminescent display of claim 7, further comprising a color-converting layer that converts the blue light from the blue light-emitting layer into green light and red light, wherein the organic electroluminescent display performs full color displaying.

9. The organic electroluminescent element of claim 1, wherein the amount of the light-emitting material included in the electron-transport layer is in a range of from 0.1 to 10 volume-% with respect to a volume of the electron-transport layer.

10. The organic electroluminescent display of claim 7, wherein the amount of the light-emitting material included in the electron-transport layer is in a range of from 0.1 to 10 volume-% with respect to a volume of the electron-transport layer.

* * * * *